(12) United States Patent
Zhao et al.

(10) Patent No.: US 11,522,341 B2
(45) Date of Patent: Dec. 6, 2022

(54) TUNABLE LASER AND LASER TRANSMITTER

(71) Applicant: HUAWEI TECHNOLOGIES CO., LTD., Guangdong (CN)

(72) Inventors: Jialin Zhao, Wuhan (CN); Wei Chen, Shenzhen (CN); Li Zeng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 248 days.

(21) Appl. No.: 16/877,707

(22) Filed: May 19, 2020

(65) Prior Publication Data

US 2020/0280172 A1    Sep. 3, 2020

Related U.S. Application Data

(63) Continuation of application No. PCT/CN2018/091820, filed on Jun. 19, 2018.

(30) Foreign Application Priority Data

Nov. 21, 2017 (CN) .......................... 201711165899.2

(51) Int. Cl.
*H01S 5/10* (2021.01)
*H01S 5/02* (2006.01)
(Continued)

(52) U.S. Cl.
CPC .......... *H01S 5/1032* (2013.01); *H01S 3/0623* (2013.01); *H01S 5/021* (2013.01);
(Continued)

(58) Field of Classification Search
CPC ...... H01S 5/1032; H01S 3/0623; H01S 5/021; H01S 5/02415; H01S 5/026; H01S 5/06821; H01S 5/1007; H01S 5/141; H01S 5/50
See application file for complete search history.

(56) References Cited

U.S. PATENT DOCUMENTS 3,871,742 A * 3/1975 Kaminow ............ G02B 6/4206
385/37
2003/0219045 A1   11/2003 Orenstein et al.
(Continued)

FOREIGN PATENT DOCUMENTS

CN       1862898 A       11/2006
CN     103592776 A        2/2014
(Continued)

OTHER PUBLICATIONS

Vijaysekhar Jayaraman et al., "Theory, Design, and Performance of Extended Tuning Range Semiconductor Lasers with Sampled Gratings," IEEE Journal of Quantum Electronics, vol. 29, No. 6., Jun. 1993 (11 pages).
(Continued)

*Primary Examiner* — Yuanda Zhang
(74) *Attorney, Agent, or Firm* — WHDA, LLP

(57) ABSTRACT

A tunable laser includes a reflective semiconductor optical amplifier (SOA), a grating codirectional coupler, and a reflective microring resonator. The grating codirectional coupler and the reflective microring resonator are both formed on a silicon base. An anti-reflection film is disposed on a first end surface of the reflective SOA, and the first end surface is an end surface, coupled to a first waveguide of the grating codirectional coupler, of the reflective SOA. A second waveguide of the grating codirectional coupler is coupled to the first waveguide, a first grating is disposed on the first waveguide, a second grating disposed opposite to
(Continued)

the first grating is disposed on the second waveguide, and the first grating and the second grating constitute a narrow-band pass filter. The second waveguide is connected to the reflective microring resonator.

20 Claims, 6 Drawing Sheets

(51) Int. Cl.
    *H01S 5/026*     (2006.01)
    *H01S 5/068*     (2006.01)
    *H01S 5/14*     (2006.01)
    *H01S 5/50*     (2006.01)
    *H04B 10/50*     (2013.01)
    *H01S 5/024*     (2006.01)
    *H01S 3/06*     (2006.01)

(52) U.S. Cl.
    CPC .......... *H01S 5/026* (2013.01); *H01S 5/02415* (2013.01); *H01S 5/06821* (2013.01); *H01S 5/1007* (2013.01); *H01S 5/141* (2013.01); *H01S 5/50* (2013.01); *H04B 10/503* (2013.01)

(56) References Cited

U.S. PATENT DOCUMENTS

| | | | |
|---|---|---|---|
| 2005/0141809 | A1 | 6/2005 | Gardner et al. |
| 2006/0222038 | A1 | 10/2006 | Yamazaki |
| 2010/0142567 | A1 | 6/2010 | Ward et al. |
| 2011/0274438 | A1 | 11/2011 | Fiorentino et al. |
| 2013/0016423 | A1 | 1/2013 | Zheng et al. |
| 2016/0109659 | A1* | 4/2016 | Jiang ................... H01L 31/167 438/24 |
| 2016/0156149 | A1 | 6/2016 | Takabayashi et al. |
| 2016/0226218 | A1 | 8/2016 | Larson |
| 2018/0191132 | A1 | 7/2018 | Hu et al. |

FOREIGN PATENT DOCUMENTS

| | | |
|---|---|---|
| CN | 102349013 B | 4/2014 |
| CN | 104104011 A | 10/2014 |
| CN | 104966989 A | 10/2015 |
| CN | 105322438 A | 2/2016 |
| CN | 103904555 B | 3/2017 |
| CN | 106785882 A | 5/2017 |
| JP | 2016102926 A | 6/2016 |
| WO | WO-2007107186 A1 * | 9/2007 ........... H01S 5/0612 |

OTHER PUBLICATIONS

P.-J. Rigole et al., "Wavelength coverage over 67 nm with a GCSR laser Tuning characteristics and switching speed." 1996 (2 pages).
Tomohiro Kita et al., "Narrow Spectral Linewidth Silicon Photonic Wavelength Tunable Laser Diode for Digital Coherent Communication System," IEEE Journal of Selected Topics in Quantum Electronics, 2016 (13 pages).
J. Blumenthal et al., "Accelerated Aging and Reliability Studies of Multisection Tunable GCSR Lasers for Dense WDM Applications," 2000 (3 pages).
Duprez et al., "Highly tunable heterogeneously integrated III-V on silicon sampled-grating distributed Bragg reflector lasers operating in the O-band," Optics Express 20895, vol. 24, No. 18, Sep. 5, 2016 (9 pages).
Keyvaninia et al., "Demonstration of a heterogeneously integrated III-V SOI single wavelength tunable laser," Optics Express 3784, vol. 21, No. 3, Feb. 11, 2013 (9 pages).
De Valicourt et al., "Direct Modulation of Hybrid-Integrated InP/Si Transmitters for Short and Long Reach Access Network," Journal of Lightwave Technology, vol. 33, No. 8, Apr. 15, 2015 (9 pages).
Hulme et al., "Widely tunable Vernier ring laser on hybrid silicon," Optics Express 19718, vol. 21, No. 17, Aug. 26, 2013 (5 pages).
International Search Report dated Aug. 17, 2018, issued in counterpart CN Application No. PCT/CN2018/091820, with English translation (12 pages).
Office Action dated Dec. 2, 2019, issued in counterpart CN Application No. 201711165899.2, with English translation (10 pages).
Extended (Supplementary) European Search Report dated Nov. 27, 2020, issued in counterpart EP Application Mo. 18881612.8. (9 pages).

* cited by examiner

TUNABLE LASER AND LASER TRANSMITTER

CROSS-REFERENCE TO RELATED APPLICATIONS

This application is a continuation of International Patent Application No. PCT/CN2018/091820, filed on Jun. 19, 2018, which claims priority to Chinese Patent Application No. 201711165899.2, filed on Nov. 21, 2017. The disclosures of the aforementioned applications are hereby incorporated by reference in their entireties.

TECHNICAL FIELD

This application relates to the field of optical technologies, and in particular, to a tunable laser and a laser transmitter.

BACKGROUND

A tunable laser is a laser that can continuously change a laser output wavelength within a specific range. To implement a wavelength tuning range of a broadband (for example, covering a C-band), a vernier tuning mechanism is usually used for implementing wavelength tuning. A structure with two wavelength-adjustable filters is disposed in the laser, the two filters each have a comb-shaped filtering spectral line, and the two filtering spectral lines have different free spectral ranges (FSR). When a pair of center wavelengths in the filtering spectral line of the two filters are aligned, another pair of filtering peaks are staggered, so that a filtering spectral line at an alignment location has a maximum value. Then a laser is output. When a filtering spectral line of a filter is adjusted by changing a refractive index of the filter by using an overcurrent injection effect, a thermal effect, or a piezo-optic effect, an output wavelength of the laser hops, so as to implement laser tuning.

FIG. 1 is a double-microring tunable laser disclosed in related art. The tunable laser includes a semiconductor optical amplifier (SOA) 11 and a silicon waveguide. The silicon waveguide includes a thermal tuning microring resonator 12 and a thermal tuning microring resonator 13, and each microring resonator includes two parallel straight waveguides and one annular waveguide. The SOA 11 provides an optical gain, and the microring resonator 13 is connected to a loop mirror 14 to constitute one resonant cavity end surface of the laser. An end surface of the SOA 11 that is coupled to the silicon waveguide is coated with an anti-reflection film to constitute the other resonant cavity end surface of the laser. The other end surface of the SOA is coated with a lowly reflective film, and a laser is mainly output from an end surface of the lowly reflective film. The wavelength tuning may be implemented by using a thermal tuning unit that is connected to the microring resonator 12, or the microring resonator 13, or the loop mirror 14.

However, the vernier tuning mechanism requires that a wavelength should be calibrated, and wavelength calibration is difficult. In addition, in a process of vernier tuning wavelengths of the two microring resonators need to be controlled; but the silicon waveguide is thermally sensitive, and filtering spectrum drift is apparent under impact of temperature. Consequently, it is difficult to accurately control the wavelengths. It can be learned from the foregoing that the existing tunable laser has a high manufacturing process requirement and tuning control is difficult.

SUMMARY

This application provides a tunable laser and a laser transmitter. The tunable laser and the laser transmitter may enable wavelength tuning to be implemented more easily and a wavelength tuning speed to be higher, thereby reducing costs of a wavelength test process.

A first aspect provides a tunable laser, including a reflective SOA, a grating codirectional coupler, and a reflective microring resonator, where an anti-reflection film is disposed on a first end surface of the reflective SOA; a second waveguide of the grating codirectional coupler is coupled to a first waveguide, a first grating is disposed on the first waveguide, a second grating disposed opposite to the first grating is disposed on the second waveguide, and the first grating and the second grating constitute a narrow-band pass filter; and the second waveguide is connected to the reflective microring resonator. The grating codirectional coupler and the reflective microring resonator are both formed on a silicon base, and the first end surface is an end surface, coupled to the first waveguide of the grating codirectional coupler, of the reflective SOA. According to this implementation, the reflective SOA, the grating codirectional coupler, and the reflective microring resonator constitute a resonant cavity. The narrow-band pass filter has a single-bandpass filtering spectrum in a specified band (for example, a C-band), the microring resonator has a comb-shaped filtering spectrum, and after light passes through the narrow-band pass filter and the microring resonator, a single longitudinal mode laser can be formed to oscillate in the resonant cavity, thereby outputting a laser. Usually, the narrow-band pass filter has only one wave peak in the filtering spectrum of the specified band, and a filtering spectrum of the reflective microring resonator is comb-shaped. In this way, different center wavelengths do not need to be controlled for alignment, and only one center wavelength of the narrow-band pass filter and a center wavelength of the reflective microring resonator need to be controlled for alignment. Therefore, wavelength tuning is easier to be implemented, and a wavelength tuning speed is higher.

In a possible implementation, a highly reflective film is disposed on a second end surface of the reflective SOA, and the second end surface is an end surface opposite to the first end surface. In this way, after the laser is reflected by the highly reflective film in the reflective SOA, main optical energy is output from the reflective microring resonator.

In another possible implementation, a lowly reflective film is disposed on a second end surface of the reflective SOA, and the second end surface is an end surface opposite to the first end surface. In this way, after the laser oscillates in the resonant cavity, main optical energy is output from the lowly reflective film of the reflective SOA.

In another possible implementation, a second end surface of the reflective SOA is a cleavage surface, and the second end surface is an end surface opposite to the first end surface. The cleavage surface is a type of crystal surface formed by a trans-granular fracture that is generated under the action of an external force. An optical reflectivity of the cleavage surface is approximately 33%. After the laser oscillates in the resonant cavity, the laser may be output from the second end surface.

In another possible implementation, the reflective microring resonator includes a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide; and the second waveguide is connected to both a first end of the first straight waveguide and a first end of the second straight waveguide by using a Y-type optical waveguide. In this way, a manner of connecting the grating codirectional coupler and the reflective microring resonator is provided.

In another possible implementation, the reflective microring resonator includes a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide; and the second waveguide is connected to both a first end of the first straight waveguide and a first end of the second straight waveguide by using a multimode interferometer. In this way, another manner of connecting the grating codirectional coupler and the reflective microring resonator is provided.

In another possible implementation, the first grating and the second grating have a same grating period, and a projection of the first grating on the second waveguide completely or partially overlaps with the second grating. A length of a staggered part between the projection of the first grating on the second waveguide and the second grating is also referred to as a relative location difference. A relative location difference and a passband bandwidth of the narrow-band pass filer have a correspondence. In this way, by setting the relative location difference between the first grating and the second grating, a bandwidth of the narrow-band pass filter that is constituted by the first grating and second grating is determined.

In another possible implementation, a phase adjustment unit that is configured to adjust an optical phase is disposed on the grating codirectional coupler and/or the reflective microring resonator. When a laser is tuned, a filtering spectrum of the narrow-band pass filter may be tuned by using the phase adjustment unit on the grating codirectional coupler, and a filtering spectrum of the reflective microring resonator may be tuned by using the phase adjustment unit on the reflective microring resonator. Usually, the narrow-band pass filter has only one wave peak in the filtering spectrum of the specified band, and a filtering spectrum of the reflective microring resonator is comb-shaped. In this way, different center wavelengths do not need to be controlled for alignment, and only one center wavelength of the narrow-band pass filter and a center wavelength of the reflective microring resonator need to be controlled for alignment. Therefore, wavelength tuning is easier to be implemented, and a wavelength tuning speed is higher.

In another possible implementation, a first phase adjustment unit is disposed in a non-grating area of the grating codirectional coupler, a second phase adjustment unit is disposed in a grating area of the grating codirectional coupler, and a third phase adjustment unit is disposed on an annular waveguide. In this way, the first phase adjustment unit may finely adjust an output wavelength, and the second phase adjustment unit and the third phase adjustment unit may coarsely adjust the output wavelength.

In another possible implementation, a second end of the first straight waveguide and a second end of the second straight waveguide are separately connected to a second Y-type optical waveguide or a multimode interferometer. When the second waveguide is connected to both the first end of the first straight waveguide and the first end of the second straight waveguide by using the Y-type optical waveguide or the multimode interferometer, the second end of the first straight waveguide and the second end of the second straight waveguide are separately connected to the second Y-type optical waveguide or the multimode interferometer. In this way, light passing through the first straight waveguide and the second straight waveguide is output by using the second Y-type optical waveguide or the multimode interferometer.

Furthermore, a fourth phase adjustment unit is disposed on the first straight waveguide. By tuning the fourth phase adjustment unit, a light field phase difference between the first straight waveguide and the second straight waveguide in the reflective microring resonator may be adjusted, to enable output optical power to be maximum and a coupling loss to be minimum.

In the foregoing implementations, the phase adjustment unit may be a thermal tuning unit, a current tuning unit, or a piezo-optic tuning unit.

A second aspect provides a laser transmitter, including a tunable laser and a signal modulation apparatus, where the tunable laser includes a reflective semiconductor optical amplifier SOA, a grating codirectional coupler, and a reflective microring resonator; an anti-reflection film is disposed on a first end surface of the reflective SOA, and a highly reflective film is disposed on a second end surface of the reflective SOA; a second waveguide of the grating codirectional coupler is coupled to a first waveguide, a first grating is disposed on the first waveguide, a second grating disposed opposite to the first grating is disposed on the second waveguide, the first grating and the second grating constitute a narrow-band pass filter, and the second waveguide is connected to the reflective microring resonator, the reflective microring resonator includes a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide; and the signal modulation apparatus may modulate optical signals that are output from the first straight waveguide and the second straight waveguide into a polarization multiplexing high-order modulation signal. The grating codirectional coupler and the reflective microring resonator are both formed on a silicon base, the first end surface is an end surface, coupled to the first waveguide of the grating codirectional coupler, of the reflective SOA, and the second end surface is an end surface opposite to the first end surface. According to this implementation, the laser transmitter may modulate a laser from the tunable laser into a polarization multiplexing high-order modulation signal, and then output the polarization multiplexing high-order modulation signal. In addition, an output signal may be adjusted by tuning a wavelength of the laser.

In a possible implementation, the signal modulation apparatus includes at least two signal modulators, a polarization beam splitter and rotator and the signal modulator is a Mach Zehnder modulator. In this way, a specific and feasible laser transmitter is provided.

In another possible implementation, the second waveguide is connected to both a first end of the first straight waveguide and a first end of the second straight waveguide by using a Y-type optical waveguide.

In another possible implementation, the second waveguide is connected to both a first end of the first straight waveguide and a first end of the second straight waveguide by using a multimode interferometer.

In another possible implementation, the first grating and the second grating have a same grating period, and a projection of the first grating on the second waveguide completely or partially overlaps with the second grating.

In another possible implementation, a phase adjustment unit that is configured to adjust an optical phase is disposed on the grating codirectional coupler and/or the reflective microring resonator.

In another possible implementation, a first phase adjustment unit is disposed in a non-grating area of the grating codirectional coupler, a second phase adjustment unit is disposed in a grating area of the grating codirectional coupler, and a third phase adjustment unit is disposed on the annular waveguide.

In another possible implementation, the phase adjustment unit may be a thermal tuning unit, a current tuning unit, or a piezo-optic tuning unit.

It can be learned from the foregoing that this application has the following advantages:

The tunable laser includes the reflective SOA, the grating codirectional coupler, and the reflective microring resonator. The anti-reflection film is disposed on the first end surface of the reflective SOA, the second waveguide of the grating codirectional coupler is coupled to the first waveguide, the first grating is disposed on the first waveguide, the second grating disposed opposite to the first grating is disposed on the second waveguide, and the first grating and the second grating constitute the narrow-band pass filter; and the second waveguide is connected to the reflective microring resonator. Usually, the narrow-band pass filter has only one wave peak in a filtering spectrum of a specified band, and a filtering spectrum of the reflective microring resonator is comb-shaped. In this way, different center wavelengths do not need to be controlled for alignment, and only one center wavelength of the narrow-band pass filter and a center wavelength of the reflective microring resonator need to be controlled for alignment. Therefore, wavelength tuning is easier to be implemented by the tunable laser of this application, and a wavelength tuning speed is higher.

DESCRIPTION OF EMBODIMENTS

To resolve a problem that a wavelength is difficult to be calibrated and controlled due to a vernier effect, some embodiments of this application use a narrow-band pass filter and a reflective microring resonator to perform filtering. Because the narrow-band pass filter may form a bandpass in a specified band, wavelength calibration is easier to be performed on the narrow-band pass filter, and wavelength alignment of a center wavelength of the narrow-band pass filter and a center wavelength of the reflective microring resonator is easier.

Figure 1:
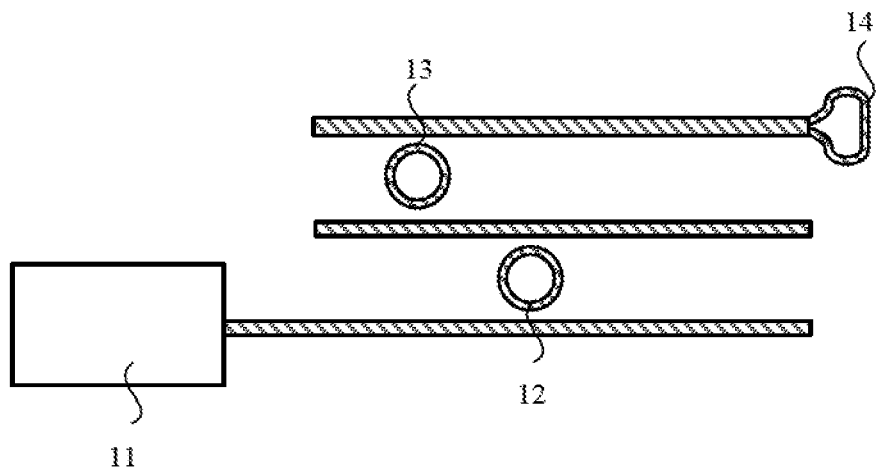
FIG. 1 is a schematic diagram of a tunable laser in the related art.
Figure 2:
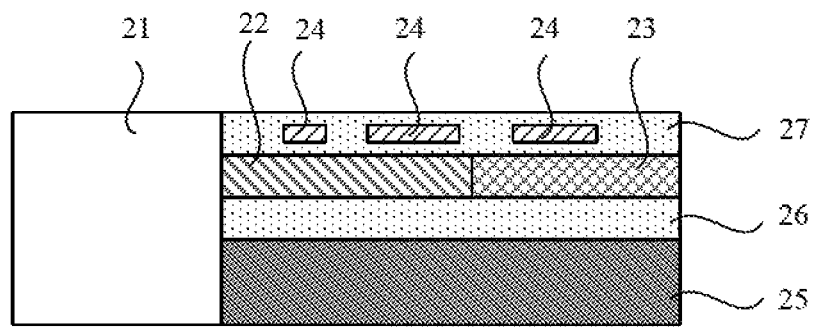
FIG. 2 is a side view of a tunable laser according to an embodiment of this application.

The following describes a tunable laser provided in this application. FIG. 2 is a side view of the tunable laser according to an embodiment of this application. Referring to FIG. 2, according to an embodiment of this application, the tunable laser includes:

a reflective SOA 21, a grating codirectional coupler 22, and a reflective microring resonator 23, where the grating codirectional coupler 22 and the reflective microring resonator 23 are both formed on a silicon base. The reflective SOA 21 and the grating codirectional coupler 22 are coupled in a butt coupling or a wafer bonding manner.

A phase adjustment unit 24 that is configured to adjust an optical phase is disposed on the grating codirectional coupler 22. The phase adjustment unit 24 may be a thermal tuning unit, a current tuning unit, or a piezo-optic tuning unit. The silicon base includes a silicon substrate 25 and a silicon dioxide $SiO_2$ layer 26 that is disposed on the silicon substrate 25. A covering layer 27 is disposed on the grating codirectional coupler 22. When the phase adjustment unit 24 is the thermal tuning unit, the phase adjustment unit 24 is embedded in the covering layer 27, and the phase adjustment unit 24 and the grating codirectional coupler 22 are separated by the covering layer 27. The covering layer 27 may be made of a material of silicon dioxide.

It should be noted that there may be one or more phase adjustment units 24. The phase adjustment unit 24 may be disposed on only the reflective microring resonator 23, or the phase adjustment unit 24 may be disposed on both the grating codirectional coupler 22 and the reflective microring resonator 23. It may be understood that the phase adjustment unit 24 may alternatively be disposed in another direction around the grating codirectional coupler 22 and/or the reflective microring resonator 23, for example, disposed in parallel with the grating codirectional coupler 22 and/or the reflective microring resonator 23, or disposed below the grating codirectional coupler 22 and/or the reflective microring resonator 23.

The reflective SOA 21, the grating codirectional coupler 22, and the reflective microring resonator 23 constitute a resonant cavity. When a center wavelength of the grating codirectional coupler 22 and a center wavelength of the reflective microring resonator 23 are aligned, after light generated by the reflective SOA 21 is resonated by the resonant cavity, a laser may be output from the reflective microring resonator 23 or the reflective SOA 21, and a wavelength of the output laser is close to the center wavelength.

Figure 3:
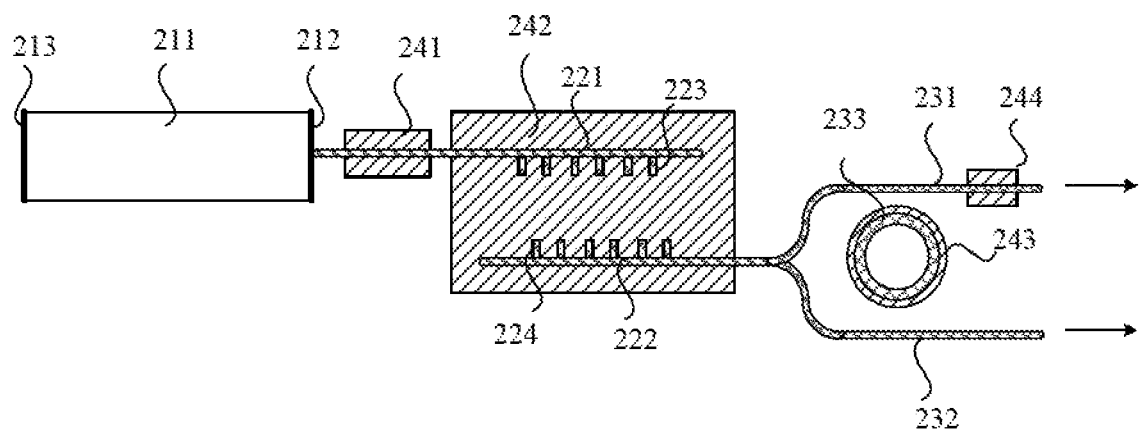
FIG. 3 is a schematic structural diagram of a tunable laser according to an embodiment of this application.

First, a tunable laser for outputting an optical signal from the microring resonator 23 is described. FIG. 3 is a top cross-sectional view of a tunable laser according to an embodiment of this application. Referring to FIG. 3, according to another embodiment of this application, the tunable laser includes:

a reflective SOA 21, a grating codirectional coupler 22, a reflective microring resonator 23, and a phase adjustment unit 24.

The reflective SOA 21 includes a reflective SOA body 211, an anti-reflection film 212 is disposed on a first end surface of the reflective SOA 21, and a highly reflective film 213 is disposed on a second end surface. The first end surface is an end surface, coupled to a first waveguide 221 of the grating codirectional coupler 22, of the reflective SOA 21, and the second end surface is an end surface opposite to the first end surface.

A second waveguide 222 of the grating codirectional coupler 22 is coupled to the first waveguide 221, a first grating 223 is disposed on the first waveguide 221, a second grating 224 disposed opposite to the first grating 223 is disposed on the second waveguide 222, and the first grating 223 and the second grating 224 constitute a narrow-band pass filter. The second waveguide 222 is connected to the reflective microring resonator 23.

The reflective microring resonator 23 includes a first straight waveguide 231, a second straight waveguide 232, and an annular waveguide 233, the annular waveguide 233 is located between the first straight waveguide 231 and the second straight waveguide 232, and light field coupling exists between the first straight waveguide 231 and the annular waveguide 233, and between the second straight waveguide 232 and the annular waveguide 233. The second waveguide 222 is connected to both a first end of the first straight waveguide 231 and a first end of the second straight waveguide 232 by using a Y-type optical waveguide. It should be noted that the second waveguide 222 may alternatively be connected to both the first end of the first straight waveguide 231 and the first end of the second straight waveguide 222 by using a multimode interferometer (Multimode Interferometer, MMI), the MMI is of a 1×2 structure, and divides an input optical signal into 2 optical signals. The second waveguide 222, the Y-type optical waveguide, the first straight waveguide 231, and the second straight waveguide 232 may be integrally formed.

A first phase adjustment unit 241 is disposed in a non-grating area of the grating codirectional coupler 22, a second phase adjustment unit 242 is disposed in a grating area of the grating codirectional coupler 22, and a third phase adjustment unit 243 is disposed on the annular waveguide 233. A fourth phase adjustment unit 244 is disposed on the first straight waveguide 231.

The first phase adjustment unit 241 may be disposed in a non-grating area of the first waveguide 221 or a non-grating area of the second waveguide 222. The first phase adjustment unit 241 is configured to finely adjust a wavelength of light output by the laser.

The second phase adjustment unit 242 is configured to adjust a filtering spectrum of the narrow-band pass filter, to coarsely adjust a wavelength.

The third phase adjustment unit 243 is configured to adjust a filtering spectrum of the reflective microring resonator, to coarsely adjust a wavelength. When coarsely adjusted based on a principle of the tunable laser, the wavelength is changed in a stepped manner.

The fourth phase adjustment unit 244 is configured to change a refractive index of the first straight waveguide 231, to form a needed phase difference between a laser output from the first straight waveguide 231 and a laser output from the second straight waveguide 232.

It should be noted that, in practical application, one or more phase adjustment units may be disposed based on a phase tuning requirement. The phase adjustment unit may alternatively be disposed on the second straight waveguide 232, to change a refractive index of the second straight waveguide 232, and to change an optical phase. Alternatively the phase adjustment unit is disposed on each of the first straight waveguide 231 and the second straight waveguide 232.

In this embodiment, the highly reflective film of the reflective SOA 21 constitutes a resonant cavity end surface, and the reflective microring resonator 23 constitutes another resonant cavity end surface. After light is generated from the reflective SOA 21, the light is resonated in the resonant cavity, and then is output from a second end of the first straight waveguide 231 and a second end of the second straight waveguide 232. The narrow-band pass filter has only one wave peak in a filtering spectrum of a specified band, and a filtering spectrum of the reflective microring resonator is comb-shaped. In this way, different center wavelengths do not need to be controlled for alignment, and only one center wavelength of the narrow-band pass filter and a center wavelength of the reflective microring resonator need to be controlled for alignment. Therefore, wavelength tuning is easier to be implemented by the tunable laser of this embodiment, and a wavelength tuning speed is higher.

Figure 4:
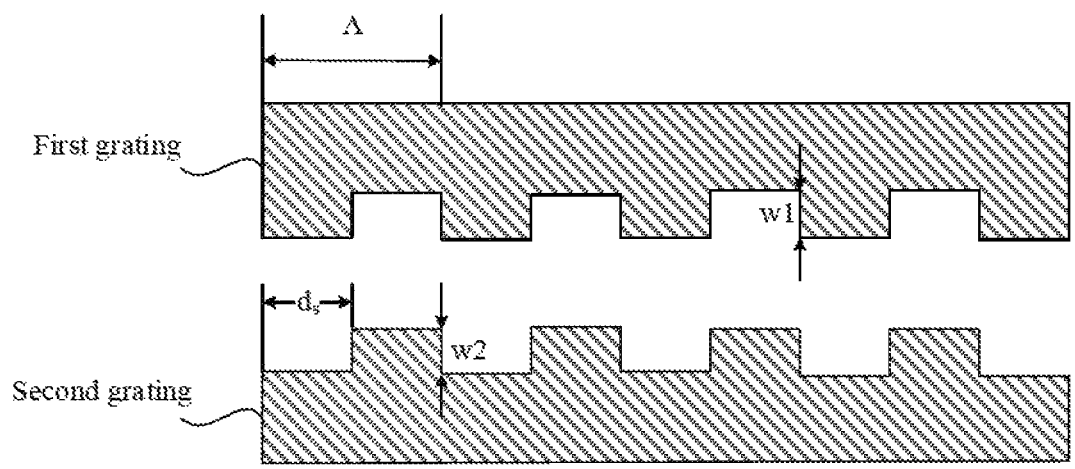
FIG. 4 is a schematic diagram of a first grating and a second grating according to an embodiment of this application.

Referring to FIG. 4, in alone embodiment, a first grating 223 and a second grating 224 have a same grating period, and a projection of the first grating 223 on the second waveguide 222 completely or partially overlaps with the second grating 224. The first grating 223 may be formed on the first waveguide 221 through periodic etching, and the second grating 224 may be formed on the second waveguide 222 through periodic etching.

The following describes a filtering spectrum of a narrow-band pass filter constituted by two gratings:

A calculation formula of an equivalent coupling factor k of the grating codirectional coupler is as follows:

$$k = \sqrt{k_1^2 + k_2^2 + 2k_1 k_2 \, \cos\left(\pi \frac{2d_s}{\Lambda}\right)}$$

$k_1$ represents a coupling factor of the first grating, $k_2$ represents a coupling factor of the second grating, $\Lambda$ represents a grating period, and $d_s$ represents a relative location difference between the first grating and the second grating. The relative location difference is a length of a staggered part between the projection of the first grating 223 on the second waveguide and the second grating 224. A width of the first grating is w1, and a width of the second grating is w2.

It can be learned from the formula that, a larger value of $d_s$ indicates a smaller coupling factor and a smaller bandwidth of the narrow-band pass filter. The relative location difference between the first grating and the second grating in this application may be set to any one of values from 0 to $\Lambda/2$. It may be understood that, based on a period characteristic of a cos function, a case in which the relative location difference is greater than $\Lambda/2$ may be equivalent to a case in which the relative location difference is between 0 and $\Lambda/2$. When $d_s$ between the first grating and the second grating is equal to 0 or an integral multiple of the grating period, the first grating and the second grating have a same phase. When $d_s$ between the first grating and the second grating is not equal to 0, a phase difference exists between the first grating and the second grating.

Figure 5:
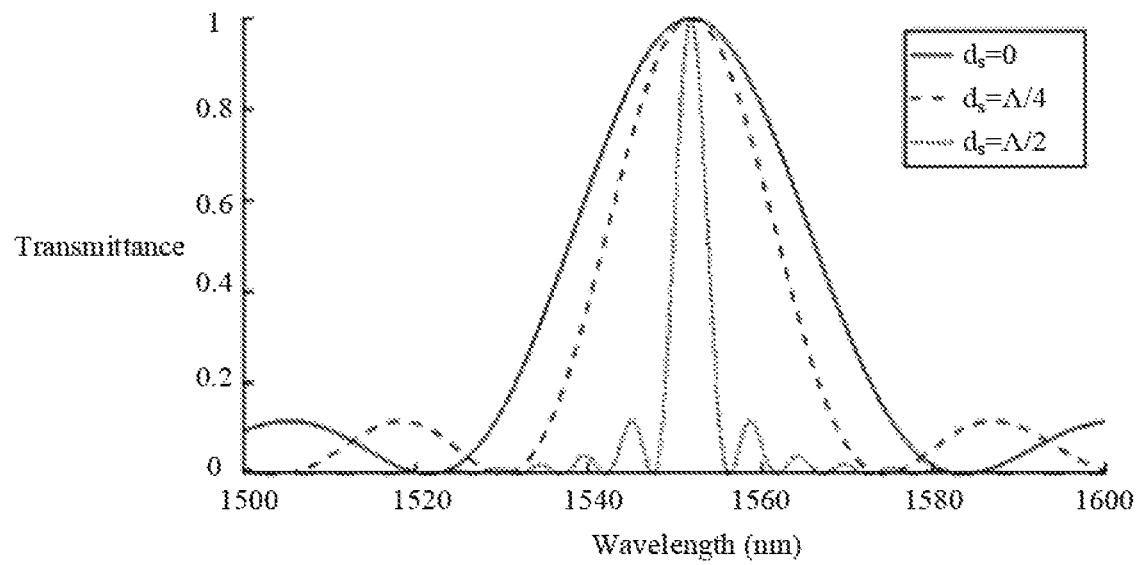
FIG. 5 is a schematic diagram of a filtering spectrum of a grating codirectional coupler according to an embodiment of this application.

As shown in FIG. 5, when $d_s$ is equal to 0 or an integral multiple of the grating period, the bandwidth of the narrow-band pass filter is maximum, and the bandwidth is approximately 1520 nm to 1580 nm. When $d_s$ is equal to $\Lambda/4$, the bandwidth is approximately 1530 nm to 1570 nm. When $d_s$ is equal to $\Lambda/2$, the bandwidth of the narrow-band pass filter is minimum, and the bandwidth is approximately 1545 nm to 1555 nm.

A calculation formula of a center wavelength $\lambda p$ of the narrow-band pass filter is:

$$\lambda_p = 2|n_{eff1} - n_{eff2}|\Lambda.$$

$n_{eff1}$ represents an effective refractive index of a symmetric mode of the grating codirectional coupler, $n_{eff2}$ represents an effective refractive index of an antisymmetric mode of the grating codirectional coupler, and $\Lambda$ is the grating period.

In this way, by adjusting the second phase adjustment unit 242, a difference between $n_{eff1}$ and $n_{eff2}$ may be adjusted, thereby changing the center wavelength of the narrow-band pass filter.

Figure 6:
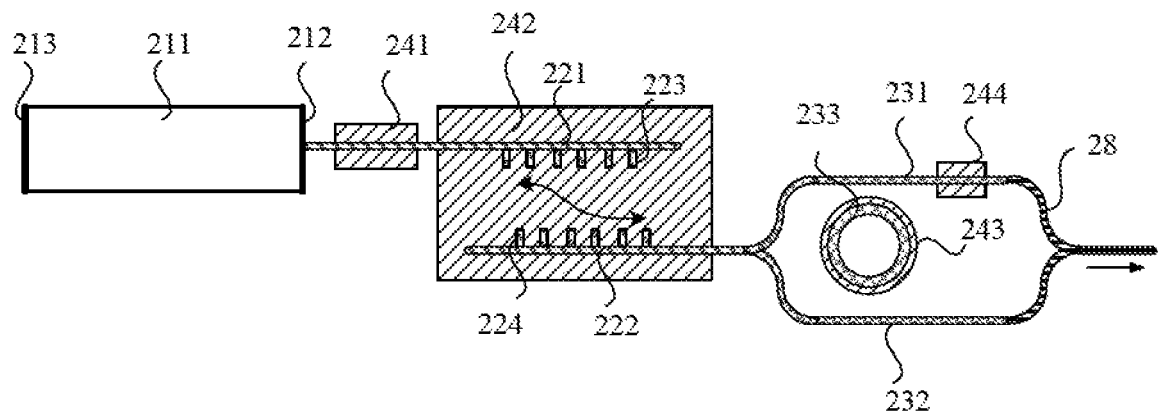
FIG. 6 is another schematic structural diagram of a tunable laser according to an embodiment of this application.

Referring to FIG. 6, based on the foregoing embodiments, in one embodiment, the second end of the first straight waveguide 231 and the second end of the second straight waveguide 232 are separately connected to the Y-type optical waveguide 28. Specifically, a coupling ratio of the first straight waveguide 231 to the annular waveguide 233 is k3, and a coupling ratio of the second straight waveguide 232 to the annular waveguide 233 is k4. To increase a transmittance of the microring resonator, k3 and k4 may be set to be not equal. In this way, a laser passing through the first straight waveguide and the second straight waveguide is output from the Y-type optical waveguide 28.

In one embodiment, the second end of the first straight waveguide 231 and the second end of the second straight waveguide 232 are separately connected to the multimode interferometer, and the multimode interferometer is of a 2×1 structure. In this way, the laser passing through the first straight waveguide and the second straight waveguide is output from the multimode interferometer.

Furthermore, the fourth phase adjustment unit 244 is disposed on the first straight waveguide. A phase of light transmitted on the first straight waveguide is changed by tuning the fourth phase adjustment unit, so that the light passing through the first straight waveguide and the second straight waveguide is coupled when passing through the Y-type optical waveguide or the MMI, an output optical power is maximum, and a coupling loss is minimum.

For ease of understanding the following describes a light output process of the tunable laser of this application in detail.

Figure 7:
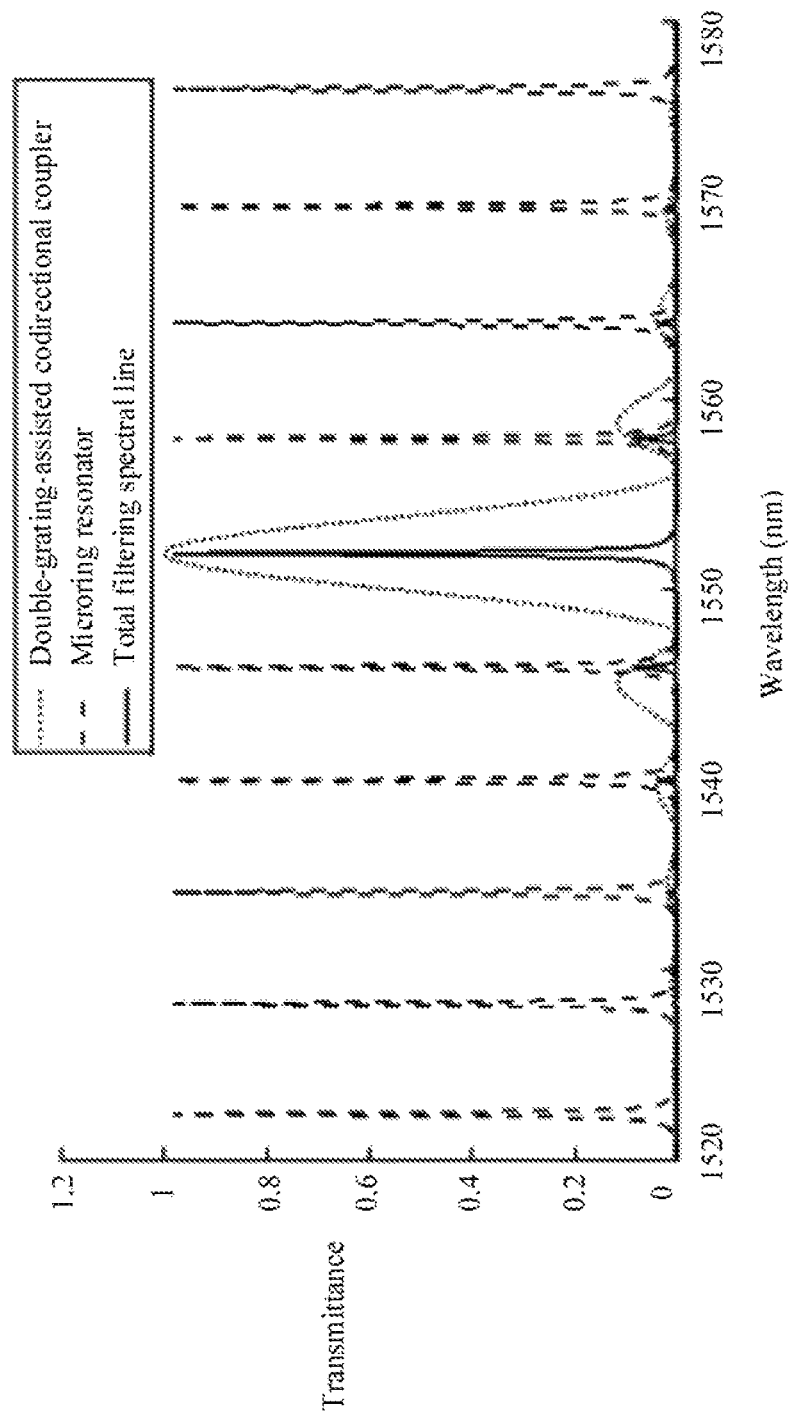
FIG. 7 is a schematic diagram of a filtering spectrum of a tunable laser according to an embodiment of this application.

In this application, the grating codirectional coupler is also referred to as a double-grating-assisted codirectional coupler. Using the tunable laser shown in FIG. 6 as an example, the relative location difference between the first grating and the second grating is $\Lambda/2$. Referring to FIG. 7, the filtering spectrum of the narrow-band pass filter is a filtering spectrum corresponding to the double-grating-assisted codirectional coupler, the filtering spectrum of the reflective microring resonator is a comb-shaped filtering spectrum, and a filtering spectrum generated after light passes through the narrow-band pass filter and the reflective microring resonator is a total filtering spectral line.

Compound light generated from the reflective SOA 21 enters the first waveguide 221, and after the compound light passes through the narrow-band pass filter constituted by the first grating 223 and the second grating 224, where using an example in which a filtering bandwidth of the narrow-band pass filter is 1547 nm to 1557 nm and a center wavelength of the narrow-band pass filter is 1552 nm, light output from the narrow-band pass filter passes through the reflective microring resonator 23, to form a single longitudinal mode laser with a laser wavelength close to 1552 nm. The single longitudinal mode laser oscillates in the resonant cavity, passes through the first straight waveguide and the second straight waveguide, and is finally converged in the Y-type optical waveguide 28 and output. It may be learned from FIG. 7 that only one wave peak with a maximum transmittance exists in the total filtering spectral line, and another wave peak is suppressed, so that the single longitudinal mode laser is easily formed.

Currently, a wavelength of the laser is close to 1552 nm. If the wavelength of the laser needs to be adjusted to a next comb-shaped filtering peak value 1558 nm of a microring, thermal tuning is used as an example. The second phase adjustment unit 242 is adjusted first, so that the filtering spectrum of the grating codirectional coupler moves towards a long wavelength direction to be aligned with a next filtering peak of the microring, and then the wavelength of the laser is finely adjusted to 1558 nm by using the first phase adjustment unit.

If the wavelength of the laser needs to be adjusted to 1555 nm between 1552 nm and 1558 nm, the second phase adjustment unit 242 and the third phase adjustment unit 243 need to be simultaneously adjusted, so that peak values of two filtering spectrums are both adjusted to be close to 1555 nm, and then a first phase area is adjusted, to finely adjust the wavelength of the laser to 1555 nm.

If a length and a width of the first straight waveguide are not completely the same as those of the second straight waveguide, when light field strength in the first straight waveguide is the same as that in the second straight waveguide, a coupling loss caused due to light field phase mismatch occurs when two paths of light are coupled by using the Y-type optical waveguide 28. When the fourth phase adjustment unit 244 is adjusted, a phase of light output by the first straight waveguide 231 may be adjusted, so that the two paths of light enter the Y-type optical waveguide 28 at a consistent phase, thereby obtaining maximum coupling efficiency. When light field strength in the first straight waveguide is not equal to that in the second straight waveguide, the coupling efficiency may also be optimized by adjusting a relative phase of the two paths of light, so that an optical output power is maximum.

Figure 8:
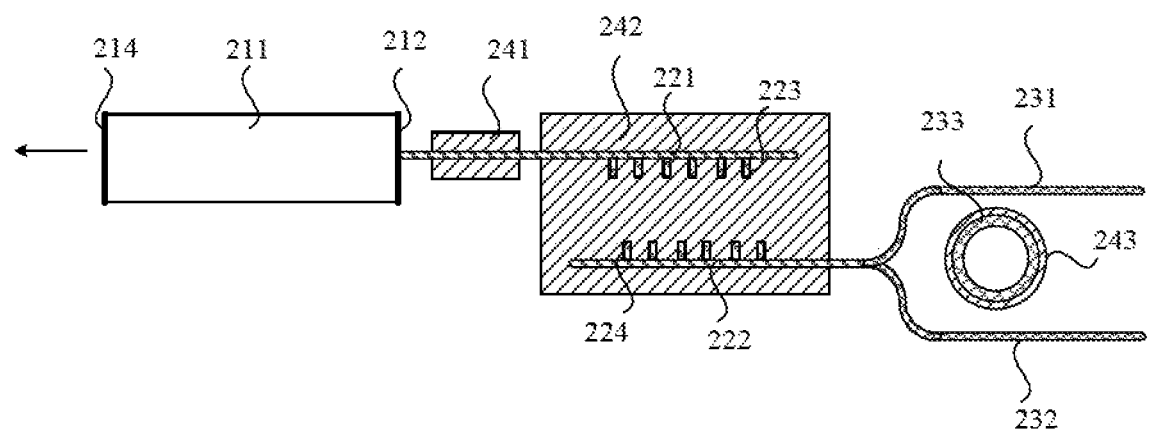
FIG. 8 is another schematic structural diagram of a tunable laser according to an embodiment of this application.

The following describes a tunable laser outputting an optical signal from the reflective SOA. Referring to FIG. 8, according to another embodiment of this application, the tunable laser includes:

a reflective SOA 21, a grating codirectional coupler 22, a reflective microring resonator 23, and a phase adjustment unit 24.

A lowly reflective film 214 is disposed on a second end surface of the reflective SOA, and the second end surface is an end surface opposite to a first end surface.

In this embodiment, for specific composition, a structure, and a connection manner of a reflective SOA body 211, an anti-reflection film 212, the grating codirectional coupler 22, the reflective microring resonator 23, and the phase adjustment unit 24, refer to the embodiment shown in FIG. 2 or FIG. 3, and details are not described herein again.

It should be noted that, when the second end surface of the reflective SOA 21 is a cleavage surface, the lowly reflective film may not be disposed on the second end surface. A reflectivity of the cleavage surface is approximately 33%. After resonated by a resonant cavity, light generated by the reflective SOA 21 may be emitted from the cleavage surface.

Figure 9:
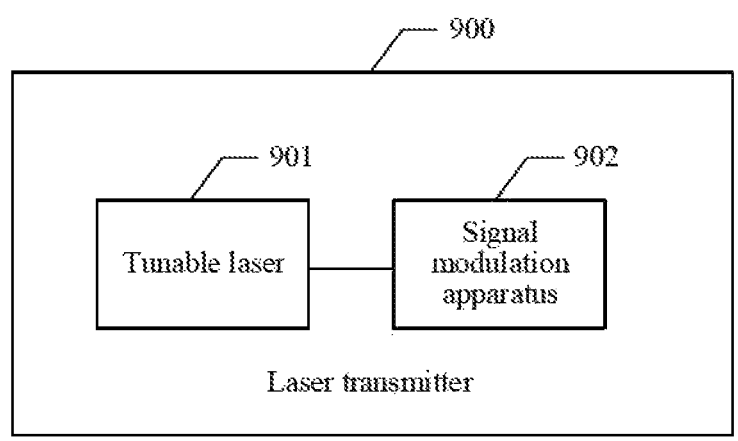
FIG. 9 is a schematic composition diagram of a laser transmitter according to an embodiment of this application.

The foregoing describes the tunable laser of this application, and the following describes a laser transmitter including the foregoing tunable laser. Referring to FIG. 9, according to an embodiment of this application, the laser transmitter 900 includes:

a tunable laser 901 and a signal modulation apparatus 902.

The tunable laser 901 includes a reflective semiconductor optical amplifier SOA, a grating codirectional coupler, and a reflective microring resonator. The grating codirectional coupler and the reflective microring resonator are both formed on a silicon base. An anti-reflection film is disposed on a first end surface of the reflective SOA, the first end surface is an end surface, coupled to a first waveguide of the grating codirectional coupler, of the reflective SOA, a highly reflective film is disposed on a second end surface of the reflective SOA, and the second end surface is an end surface opposite to the first end surface. A second waveguide of the grating codirectional coupler is coupled to the first waveguide, a first grating is disposed on the first waveguide, a second grating disposed opposite to the first grating is disposed on the second waveguide, the first grating and the second grating constitute a narrow-band pass filter, and the second waveguide is connected to the reflective microring resonator. The reflective microring resonator includes a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide.

Figure 10:
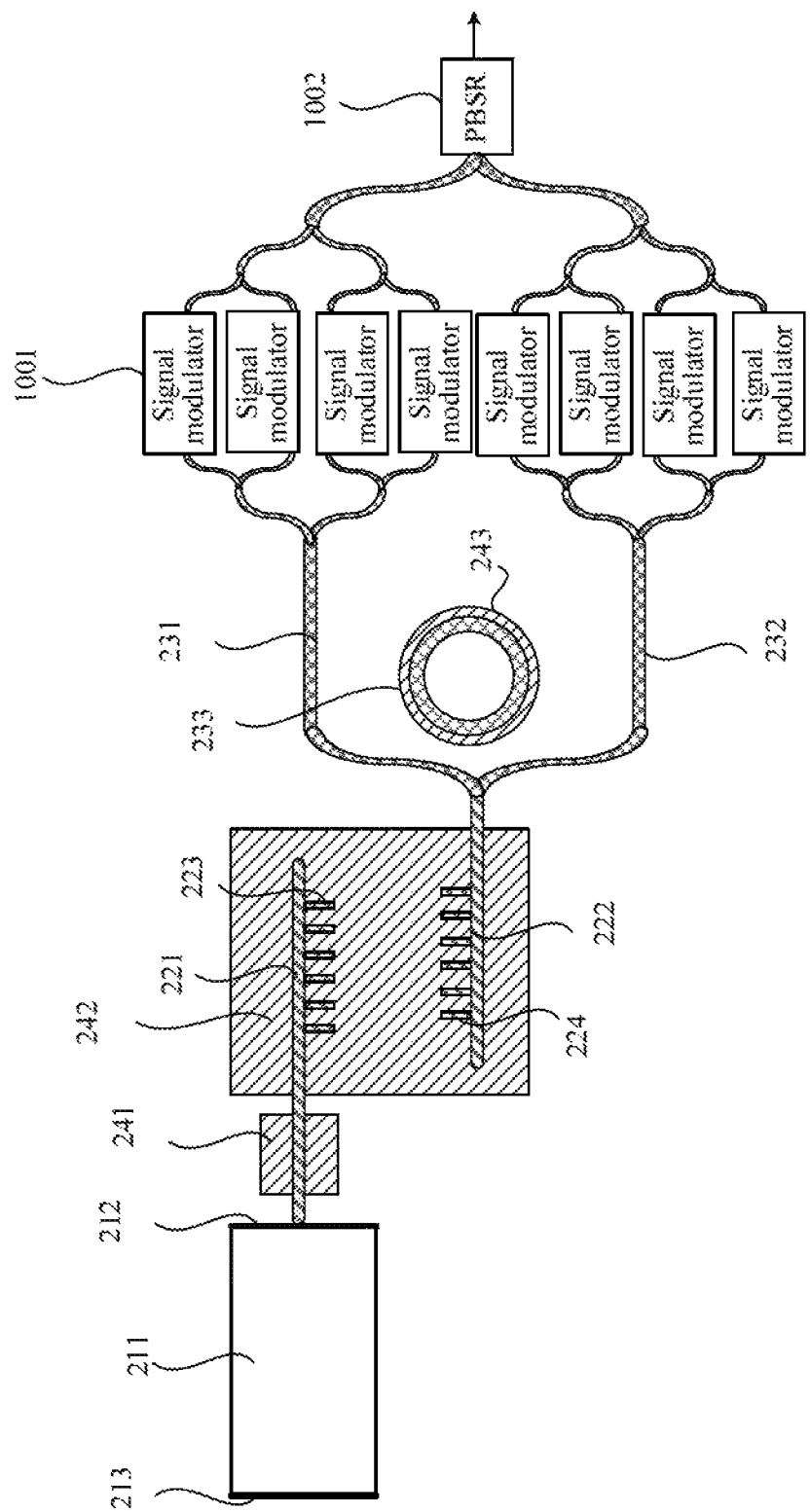
FIG. 10 is another schematic structural diagram of a laser transmitter according to an embodiment of this application.

The signal modulation apparatus 902 is configured to modulate optical signals that are output from the first straight waveguide and the second straight waveguide into a polarization multiplexing high-order modulation signal. Referring to FIG. 10, the signal modulation apparatus 902 includes a plurality of signal modulators 1001, and a polarization beam splitter and rotator (PBSR) 1002.

The first straight waveguide 231 is connected to a group of signal modulators 1001 by using one or more Y-type optical waveguides. The second straight waveguide 232 is connected to another group of signal modulators 1001 by using one or more Y-type optical waveguides. The foregoing two groups of signal modulators are connected to the PBSR 1002 by using a plurality of Y-type optical waveguides.

The signal modulator 1001 is a Mach Zehnder modulator (MZM). It should be noted that each signal modulator 1001 may be provided with a corresponding phase adjuster, to adjust a phase of a signal output from the signal modulator 1001. After light is emitted from the first straight waveguide 231 and the second straight waveguide 232, and is modulated by the signal modulator 1001, a polarization multiplexing high-order modulation signal is output from the PBSR 1002.

Optionally, the second waveguide is connected to both a first end of the first straight waveguide and a first end of the second straight waveguide by using a Y-type optical waveguide.

Optionally, the second waveguide is connected to both a first end of the first straight waveguide and a first end of the second straight waveguide by using a multimode interferometer.

Optionally, the first grating and the second grating have a same grating period, and a projection of the first grating on the second waveguide completely or partially overlaps with the second grating.

Optionally, a phase adjustment unit that is configured to adjust an optical phase is disposed on the grating codirectional coupler and/or the reflective microring resonator.

Optionally, a first phase adjustment unit is disposed in a non-grating area of the grating codirectional coupler, a second phase adjustment unit is disposed in a grating area of the grating codirectional coupler, and a third phase adjustment unit is disposed on the annular waveguide.

Optionally, the phase adjustment unit is a thermal tuning unit, a current tuning unit, or a piezo-optic tuning unit.

A component of the tunable laser 901 is similar to a corresponding component of the laser in the embodiment shown in FIG. 3 or other embodiments.

The foregoing units described as separate components may be or may not be physically separate. The coupling may be direct coupling, or indirect coupling through some interfaces.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A tunable laser, comprising:
a reflective semiconductor optical amplifier (SOA), a grating codirectional coupler, and a reflective microring resonator, wherein the grating codirectional coupler and the reflective microring resonator are both formed on a silicon base;
an anti-reflection film is disposed on a first end surface of the reflective SOA, and the first end surface is an end surface, coupled to a first waveguide of the grating codirectional coupler, of the reflective SOA; and
a second waveguide of the grating codirectional coupler is coupled to the first waveguide, a first grating is disposed on the first waveguide, a second grating disposed opposite to the first grating is disposed on the second waveguide, the first grating and the second grating constitute a narrow-band pass filter, and the second waveguide is connected to the reflective microring resonator.

2. The tunable laser according to claim 1, wherein a highly reflective film is disposed on a second end surface of the reflective SOA, and the second end surface is an end surface opposite to the first end surface.

3. The tunable laser according to claim 1, wherein a lowly reflective film is disposed on a second end surface of the reflective SOA, and the second end surface is an end surface opposite to the first end surface.

4. The tunable laser according to claim 1, wherein a second end surface of the reflective SOA is a cleavage surface, and the second end surface is an end surface opposite to the first end surface.

5. The tunable laser according to claim 1, wherein
the reflective microring resonator comprises a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide; and the second waveguide is connected to both a first end of the first straight waveguide and a first end of the second straight waveguide by using a Y-type optical waveguide.

6. The tunable laser according to claim 1, wherein the reflective microring resonator comprises a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide; and the second waveguide is connected to both a first end of the first straight waveguide and a first end of the second straight waveguide by using a multimode interferometer.

7. The tunable laser according to claim 1, wherein the first grating and the second grating have a same grating period, and a projection of the first grating on the second waveguide completely or partially overlaps with the second grating.

8. The tunable laser according to claim 1, wherein a phase adjustment unit that is configured to adjust an optical phase is disposed on the grating codirectional coupler and/or the reflective microring resonator.

9. The tunable laser according to claim 8, wherein a first phase adjustment unit is disposed in a non-grating area of the grating codirectional coupler, a second phase adjustment unit is disposed in a grating area of the grating codirectional coupler, and a third phase adjustment unit is disposed on an annular waveguide.

10. The tunable laser according to claim 8, wherein the phase adjustment unit is a thermal tuning unit, a current tuning unit, or a piezo-optic tuning unit.

11. The tunable laser according to claim 5, wherein a second end of the first straight waveguide and a second end of the second straight waveguide are separately connected to a second Y-type optical waveguide or a multimode interferometer.

12. The tunable laser according to claim 11, wherein a fourth phase adjustment unit is disposed on the first straight waveguide.

13. A laser transmitter, comprising:

a tunable laser and a signal modulation apparatus, wherein the tunable laser comprises a reflective semiconductor optical amplifier (SOA), a grating codirectional coupler, and a reflective microring resonator, wherein the grating codirectional coupler and the reflective microring resonator are both formed on a silicon base; an anti-reflection film is disposed on a first end surface of the reflective SOA, the first end surface is an end surface, coupled to a first waveguide of the grating codirectional coupler, of the reflective SOA, a highly reflective film is disposed on a second end surface of the reflective SOA, and the second end surface is an end surface opposite to the first end surface; a second waveguide of the grating codirectional coupler is coupled to the first waveguide, a first grating is disposed on the first waveguide, a second grating disposed opposite to the first grating is disposed on the second waveguide, the first grating and the second grating constitute a narrow-band pass filter, and the second waveguide is connected to the reflective microring resonator; and the reflective microring resonator comprises a first straight waveguide, a second straight waveguide, and an annular waveguide, the annular waveguide is located between the first straight waveguide and the second straight waveguide, and light field coupling exists between the first straight waveguide and the annular waveguide, and between the second straight waveguide and the annular waveguide; and the signal modulation apparatus is configured to modulate optical signals that are output from the first straight waveguide and the second straight waveguide into a polarization multiplexing high-order modulation signal.

14. The laser transmitter according to claim 13, wherein the signal modulation apparatus comprises at least two signal modulators, a polarization beam splitter and rotator; and the signal modulators are a Mach Zehnder modulator.

15. The laser transmitter according to claim 13, wherein the second waveguide is connected to both a first end of the first straight waveguide and a first end of the second straight waveguide by using a Y-type optical waveguide.

16. The laser transmitter according to claim 13, wherein the second waveguide is connected to both a first end of the first straight waveguide and a first end of the second straight waveguide by using a multimode interferometer.

17. The laser transmitter according to claim 13, wherein the first grating and the second grating have a same grating period, and a projection of the first grating on the second waveguide completely or partially overlaps with the second grating.

18. The laser transmitter according to claim 13, wherein a phase adjustment unit that is configured to adjust an optical phase is disposed on the grating codirectional coupler and/or the reflective microring resonator.

19. The laser transmitter according to claim 18, wherein a first phase adjustment unit is disposed in a non-grating area of the grating codirectional coupler, a second phase adjustment unit is disposed in a grating area of the grating codirectional coupler, and a third phase adjustment unit is disposed on the annular waveguide.

20. The laser transmitter according to claim 18, wherein the phase adjustment unit is a thermal tuning unit, a current tuning unit, or a piezo-optic tuning unit.

* * * * *